United States Patent [19]
Nguyen

[11] Patent Number: 5,943,268
[45] Date of Patent: Aug. 24, 1999

[54] NON-VOLATILE LATCH HAVING PMOS FLOATING GATE MEMORY CELLS

[75] Inventor: Chinh D. Nguyen, San Jose, Calif.

[73] Assignee: Programmable Microelectronics Corporation, San Jose, Calif.

[21] Appl. No.: 09/001,401

[22] Filed: Dec. 31, 1997

[51] Int. Cl.[6] .................................................. G11C 16/04
[52] U.S. Cl. .............................. 365/185.29; 365/189.04; 365/189.05
[58] Field of Search .............................. 365/154, 185.23, 365/185, 185.24, 218, 190, 185.01, 230.08, 185.29, 189.04, 189.05

[56] References Cited

U.S. PATENT DOCUMENTS

| | | | |
|---|---|---|---|
| 4,858,185 | 8/1989 | Kowshik | 365/181 |
| 5,065,362 | 11/1991 | Herdt et al. | 365/154 |
| 5,636,126 | 6/1997 | Coffman et al. | 365/185.22 |
| 5,761,125 | 6/1998 | Himeno | 365/185.24 |
| 5,801,994 | 9/1998 | Chang et al. | 365/185.29 |

*Primary Examiner*—David Nelms
*Assistant Examiner*—Thong Le
*Attorney, Agent, or Firm*—Flehr Hohbach Test Albritton & Herbert LLP

[57] ABSTRACT

A non-volatile latch is disclosed which includes four PMOS floating gate memory cells arranged in a 2×2 matrix. Binary data values are written to the latch by the threshold voltage of the cells, where a first binary value is written by programming all the cells, and the second binary value is written by leaving all the cells in an erased state. Thus, since a program operation is required when writing only one of the binary value, high program voltages and floating gate charge times are eliminated when writing the other binary value. After a read operation in which the binary value stored in the cells is provided as output, this binary value is automatically latched in a latch circuit. In this manner, subsequent reads to the latch do not require accessing the cells.

19 Claims, 3 Drawing Sheets

NON-VOLATILE LATCH HAVING PMOS FLOATING GATE MEMORY CELLS

BACKGROUND

1. Field of Invention

This invention relates generally to semiconductor memories and specifically to a PMOS based non-volatile memory latch.

2. Description of Related Art

Non-volatile latches are well known in the art and are used, for instance, to store addresses identifying defective memory locations, i.e., redundancy addresses. For example, a non-volatile latch for storing redundancy addresses is disclosed in U.S. Pat. No. 4,858,185, incorporated herein by reference. The latches described in that patent include NMOS floating gate memory cells. However, since NMOS memory cells require high programming and erasing voltages, the size to which these cells, and thus their associated latches, can be minimized is limited. Seeking to overcome this scaling limitation, some have proposed to employ PMOS memory cells in non-volatile latches, such as that disclosed in the commonly owned and co-pending U.S. patent application Ser. No. 08/778,802 entitled "A PMOS Non-volatile Latch for Storage of Redundancy Addresses" and filed on Jan. 3, 1997.

The above-referenced U.S. Patent Application teaches a PMOS non-volatile latch having two PMOS memory cells and a cross-coupled latch. The cross-coupled latch is formed by two PMOS memory cells PC3 and PC4 and two NMOS transistors MN1 and MN2, as shown in FIG. 1. The latch 10 is programmed to one of two binary states by forcing one of the two nodes D1 and D2 to a negative potential while holding the control gates of cells PC1 and PC2 at a constant positive potential. Forcing node D1 to the negative potential results in cell PC1 being programmed, wherein the latch 10 represents the first binary state, e.g., "1". Conversely, forcing node D2 to the negative potential results in cell PC2 being programmed, wherein the latch 10 represents the second binary state, e.g., "0".

Although requiring lower program voltages than earlier latches which employ NMOS cells, the latch 10 nevertheless requires the application of program and erase voltages in every storage operation, irrespective of the data's binary value. That is, to write a "1", cell PC1 is programmed, and to write a "0", cell PC2 is programmed. Accordingly, every storage operation requires the application of programming voltages and, in addition, is therefore limited by floating gate charge times. Further, cross-coupled latches, such as that employed in the prior art latch 10, is susceptible to fluctuations in the supply voltage which, in turn, may result in the latching of erroneous data.

SUMMARY

In accordance with the present invention, a non-volatile latch is disclosed which overcomes problems in prior art discussed above. In one embodiment of the present invention, a non-volatile latch includes four PMOS floating gate memory cells arranged in a 2×2 matrix. Since there are two columns and 2 rows of cells, alignment errors in either of the rows or columns are compensated for by complementary errors in the other of the rows or columns, respectively. Binary data is stored in the latch by the manipulating the threshold voltage of the cells, where a first binary state is represented by programming the cells, and a second binary state is represented by maintaining the cells in an erased state. Thus, a program operation is required only when data of the first binary state is to be stored. As a result, program voltages and floating gate charge times are eliminated when data of the second binary state is to be stored, thereby reducing power consumption and increasing speed. During a first read operation, the binary data stored in the cells is automatically forwarded to and latched in a latch circuit. During subsequent read operations, the binary data is provided by the latch circuit, rather than from the cells. In this manner, the voltages and access times associated with reading the cell are eliminated for all but the first read operation.

Figure 1:
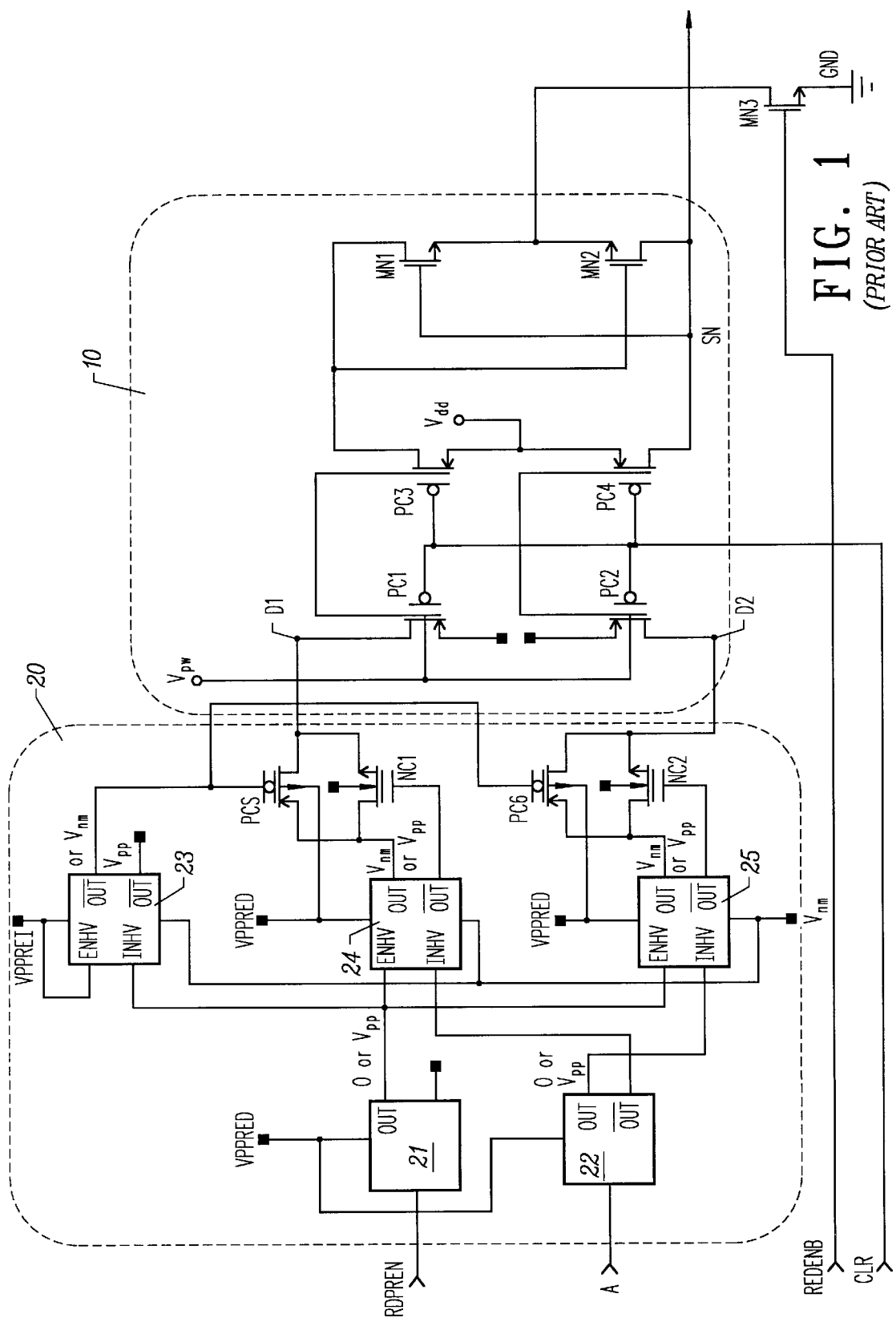
FIG. 1 is a schematic diagram of a conventional non-volatile latch in accordance with the above-referenced co-pending U.S. Patent Application.

Like components in the Figures are similarly labeled.

DETAILED DESCRIPTION

Although discussed below as including PMOS floating gate memory cells, the present invention may, in other embodiments, employ NMOS memory cells. Examples of suitable PMOS memory cells and the advantages thereof are described in the commonly owned U.S. Pat. Nos. 5,666,307 and 5,687,118 and co-pending U.S. patent applications Ser. No. 08/568,835 entitled "Triple Poly PMOS Flash Memory Cell" and filed on Dec. 7, 1995, Ser. No. 08/568,544 entitled "Double Poly Split Gate PMOS Flash Memory Cell" and filed Dec. 7, 1995, all incorporated herein by reference.

In a preferred embodiment, the cells 30 are of the type disclosed in the above-referenced U.S. patent application Ser. No. 08/557,589 as shown, for instance, in FIG. 3. The cell 30 is formed in an n– well region 32 of a p– substrate 34. A p+ source 36 and a p+ drain 38 are formed in the n– well region 32. A channel region 40 extends within the n– well 32 between the p+ source 36 and the p+ drain 38. A polysilicon floating gate 42 is insulated from the n– well region 32 by a thin oxide layer 44. Preferably, the oxide layer 44 is approximately between 80–130 Å thick and extends over the entire length of the channel region 40 and portions of both the p+ source 36 and the p+ drain 38. A control gate 46 is insulated from the floating gate 42 by an insulating layer 48. In its intrinsic state, the memory cell 30 has a negative threshold voltage $V_T$.

The cell 30 may be programmed by channel hot electron (CHE) injection, Fowler Nordheim Tunneling, band-to-band tunneling (BTBT) induced hot electron injection, or various combinations thereof. When programmed, the cell 30 has a positive threshold voltage $V_T$. The cell 30 is erased by discharging the floating gate 42 and thereby returning the threshold voltage $V_T$ thereof to a negative potential. It is the difference between the program $V_T$ and the erase $V_T$ of a cell which determines the "binary state" of the cell. Thus, the cell represents a first binary value when in a programmed state and, conversely, represents a second binary value when in an erased state. The cell 30 is read by applying a read voltage to the control gate 44. The read voltage lies between the program $V_T$ and the erase $V_T$ and, therefore, the cell 30 conducts a channel current in a programmed state.

Figure 3:
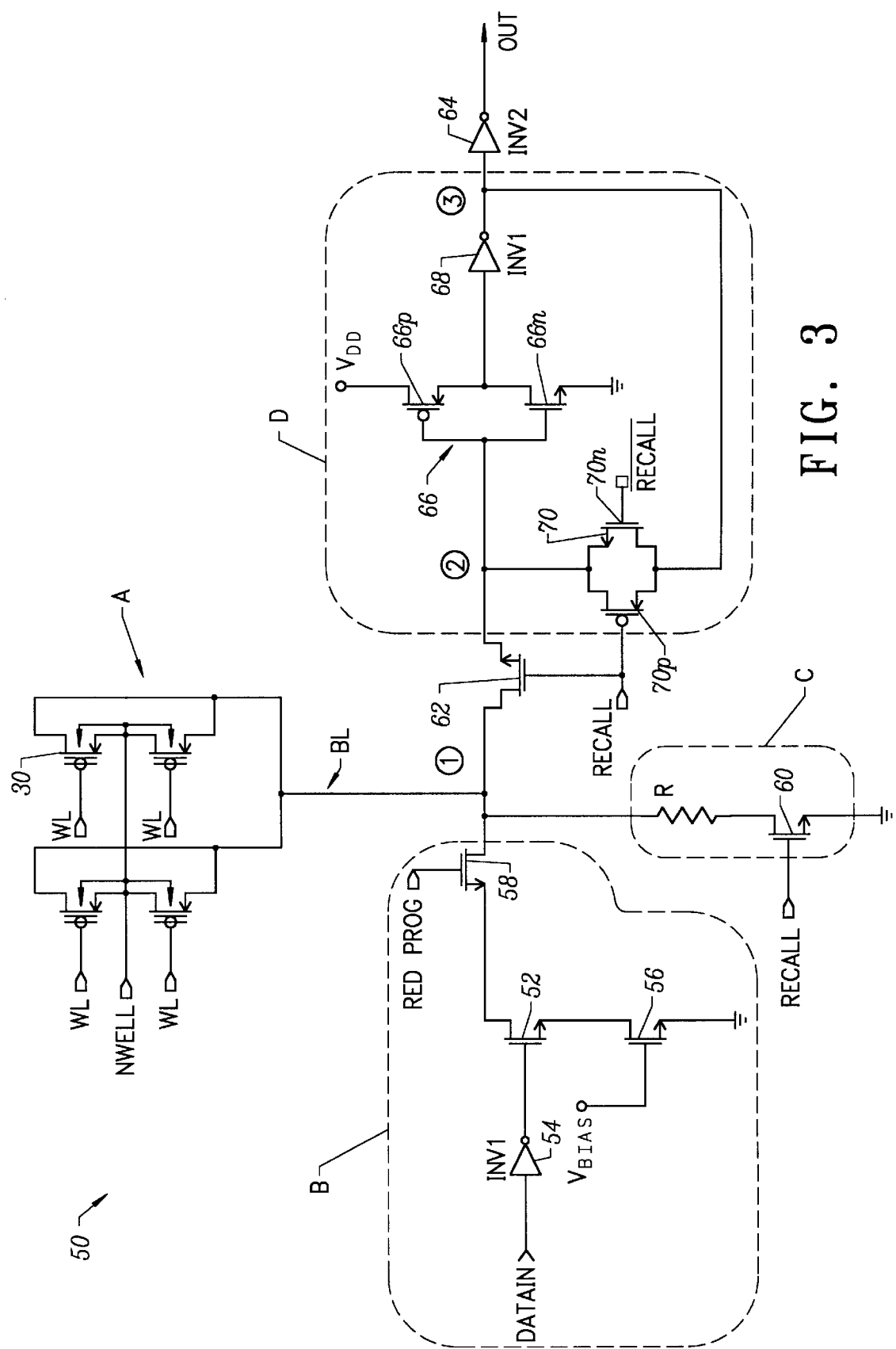
FIG. 3 is a schematic diagram of a non-volatile latch in accordance with the present invention.

FIG. 3 illustrates a non-volatile latch 50 in accordance with one embodiment of the present invention. The latch 50 includes a cell array A, an input stage B, a conversion circuit C, and a latch circuit D. The matrix A includes four PMOS cells 30 arranged in a 2×2 array and formed in a common n–well region (not shown for simplicity), the potential of which is controlled by a node NWELL. The respective sources of the cells 30 are commonly connected and, in some embodiments, are coupled to the n– well region which houses the cells 30. The respective control gates of the cells 30 are coupled to a word line WL, and the respective drains of the cells 30 are coupled to a bit line BL.

The input stage B include an input terminal DATAIN coupled to the gate of an NMOS input transistor 52 via a conventional inverting buffer circuit 54. The source of the input transistor 52 is connected to ground potential through a current limiting transistor 56. Current flow through the limiting transistor 56 is controlled by the value of a bias voltage $V_{BIAS}$. A PMOS pass transistor 58 is coupled between the input transistor 52 and the bit line BL (node 1). The gate of the pass transistor 58 is coupled to receive a redundancy program signal REDPROG.

The conversion circuit C includes a resistor R and an NMOS transistor 60 coupled between node 1 and ground potential. In a preferred embodiment, the resistor R has an impedance of approximately 30 k$\Omega$. The gate of the transistor 60 is coupled to receive a recall signal RECALL.

The latch circuit D includes an input terminal (node 2) and an output terminal (node 3). The input terminal of the latch circuit D (node 2) is coupled to the bit line BL, the input stage B, and the conversion circuit C (node 1) via a pass transistor 62 having a gate coupled to receive the signal RECALL. The output terminal (node 3) of the latch circuit D is coupled to the output terminal OUT of the non-volatile latch 50 through a conventional inverting buffer circuit 64. A CMOS inverter 66 and a conventional inverting buffer 68 are connected between the input and output terminals of the latch circuit 64, i.e., between nodes 2 and 3, respectively. A CMOS pass gate 70 is connected in parallel with the inverter 66 and buffer 68. The CMOS inverter 66 is formed by a PMOS transistor 66p and an NMOS transistor 66n connected in series between a supply voltage $V_{CC}$ and ground potential. The CMOS pass gate 70 is formed by the parallel connection of a PMOS transistor 70p and an NMOS transistor 70n, where the gates of transistor 70p and transistor 70n are coupled to receive the signal RECALL and its complement $\overline{\text{RECALL}}$, respectively. In the discussion below, the supply voltage $V_{CC}$ equals 5 volts.

In a preferred embodiment, the PMOS transistor 66p is scaled to a size relative to that of the NMOS transistor 66n so that the trip point $V_{trip}$ of the CMOS inverter 66 is approximately equal to $V_{CC}/3 \cong 1.67$ volts. Of course, in other embodiments, the relative sizes of transistors 66n and 66p may be adjusted to achieve a higher or lower $V_{trip}$.

Write Operations

When it is desired to store data in the latch 50, a program voltage $V_P$, is applied to the control gates of the PMOS cells 30 via the word line WL, and a suitable source voltage is coupled to the common source of the cells 30 and to the common n– well region via the node NWELL. The bit line BL is initially floating. The signal REDPROG is forced high to $V_{CC}$, thereby turning on the pass transistor 58 and coupling the bit line BL to the input stage B. Signal RECALL is pulled low (e.g., to ground potential) to maintain transistors 60 and 62 in a non-conductive state and thereby isolate the bit line BL from the conversion circuit C and the latch circuit D, respectively.

To write the binary value "1", a logic high signal is provided to the data input terminal DATAIN. In response thereto, the buffer circuit pulls the gate of the input transistor 52 low to ground potential. The input transistor 52 is therefore non-conductive and isolates the bit line BL from ground potential. As a result, the bit line BL remains at a floating potential which, as described in U.S. Pat. No. 5,687,118, precludes programming of the PMOS cells 30. Accordingly, the cells 30 remain in an erased state, and thereby represent a binary "1".

To write the binary value "0", a logic low signal is provided to the input node DATAIN. In response thereto, the buffer circuit 54 drives the gate of the input transistor 52 high to and thereby turns on the input transistor 52. As a result, the bit line BL is pulled to ground potential. Under these bias conditions, electrons are injected into the respective floating gates of the cells 30, as described for instance in U.S. Pat. No. 5,687,118, thereby programming the cells 30 so as to represent the binary value "0". In other embodiments, the bit line BL may be pulled to a potential other than ground potential in order to facilitate programming of the cells 30. Suitable bit line voltages, source voltages, and program voltages $V_P$ for inducing the various programming techniques mentioned above are disclosed in U.S. Pat. No. 5,687,118 and the co-pending U.S. patent application Ser. No. 08/847,850 entitled "Two Transistor Cell and Array" and filed on Oct. 9, 1997.

Reset Operations

To reset the latch 50, all of the cells 30 are erased, as follows. The signal RECALL is held low to maintain transistors 60 and 62 in a non-conductive state and thereby isolate the bit line BL from the conversion circuit C and the latch circuit D, respectively. The redundancy signal REDPROG is pulled low to turn off the pass transistor 58 and thereby isolate the bit line BL from the input stage B. The bit line BL and the drains of the cells 30 are therefore floating. The word line WL is driven to a suitable erase voltage such as, for instance, –9 volts. The common source of the cells 30 and the common n– well are held at a suitable positive voltage such as, for instance, 9 volts. Under these bias conditions, electrons are ejected from the respective floating gates of the cells 30 via FN tunneling, thereby returning the cells 30 to an erased state.

Read Operations

When retrieving data from the latch 50, the signal REDPROG is held low to maintain the pass transistor 58 in a non-conductive state and thereby isolate the input stage B from the remainder of the latch 50. The signal RECALL is driven high to $V_{CC}$ and its complement $\overline{\text{RECALL}}$ therefore transitions low to ground potential. Accordingly, transistors 60 and 62 turn on (via RECALL) and the CMOS gate 70 turns off (via RECALL and $\overline{\text{RECALL}}$). The word line WL is grounded, and the node NWELL is held at a suitable positive potential such as, for instance, approximately 3 volts. A logic signal indicative of the data stored in the cells 30 is subsequently provided at the output terminal OUT.

Thereafter, the signal RECALL and its complement $\overline{\text{RECALL}}$ transition to logic low and logic high, respectively, whereby signal RECALL turns off transistors 60 and 62 and signals RECALL and $\overline{\text{RECALL}}$ together turn on the CMOS gate 70. The non-conductive transistor 62 isolates the latch circuit D from the remainder of the latch 50. The conductive CMOS gate 70 couples nodes 2 and 3 together, thereby latching the data into the latch circuit D.

Specifically, if programmed, the cells 30 each conduct a channel current of approximately 30 μA, thereby sourcing approximately (4)(30 μA)=120μA to the bit line BL. Thus, when signal RECALL is pulsed high, transistor 60 is conductive and an IR drop of approximately (120 μA)(30 kΩ)=3.6 volts develops across the resistor R and appears at node 2 via pass transistor 62. The voltage at node 2 ($V_{N2}$) exceeds $V_{trip}$ and, therefore, by definition provides a logic high signal to the CMOS inverter 66. Transistor 66p turns off and transistor 66n turns on, thereby pulling the output of the inverter 66 low to ground potential. In response thereto, the buffer circuit 68 drives node 3 high to $V_{CC}$ and, in response thereto, the buffer circuit 64 provides a logic low signal at the output terminal OUT. Thus, a logic low signal at the output terminal OUT indicates that the cells 30 are in a programmed state.

Thereafter, the signal RECALL is pulsed low to ground potential which, in turn, forces $\overline{RECALL}$ high to $V_{CC}$. Transistor 60 turns off and closes the current path to ground through the resistor R. Transistor 62 turns off and isolates the latch circuit D from the remainder of the latch 50. The CMOS gate turns on, thereby coupling nodes 2 and 3 together. Node 2 is driven from 3.6 volts to $V_{CC}$=5 volts and, therefore, a binary "1" is latched in the latch circuit D.

Conversely, if the cells 30 are not programmed, the cells 30 do not source a channel current to the bit line BL and, since no significant voltage develops across the resistor R, nodes 1 and 2 float near ground potential. $V_{N2}$ is less than $V_{trip}$ and, therefore, node 2 provides a logic low signal to the CMOS inverter 66. In this case, transistor 66n turns off and transistor 66p turns on, thereby pulling the output terminal of the inverter 66 high to $V_{CC}$. The buffer circuit 68 therefore pulls node 3 low to ground potential and, in response thereto, the buffer circuit 64 provides a logic high signal at the output terminal OUT, thereby indicating that the cells 30 are in an erased state.

Thereafter, the signal RECALL transitions low and signal $\overline{RECALL}$ transition high which, as described above, turns off transistors 60 and 62 and turns on the CMOS 70. Node 2 is coupled to node 3 and, therefore, is pulled to ground potential. In this manner, a "0" is latched into the latch circuit D.

During subsequent read operations, data is retrieved from the latch 50 without accessing the cell 30 by simply ascertaining the logic level of the output terminal OUT, where a logic low signal at the terminal OUT indicates a data value of "0", i.e., the cells 30 are in a programmed state, and a logic high signal at the terminal OUT indicates a data value of "1", i.e., the cells 30 are in an erased state. In this manner, the voltages and access times associated with reading the cells 30 are eliminated in subsequent read operations, thereby reducing power consumption and increasing speed during read operations.

As discussed above, the voltage level of node 1, and thus $V_{N2}$, is determined by the IR drop across the resistor R and, therefore, is independent of the supply voltage $V_{CC}$. Accordingly, supply voltage fluctuations such as, for instance, ground bounce, do not affect the logic levels of signals within the latch 50.

Further, as noted above, all of the cells 30 are in either a programmed state (indicating a data value of "0") or an erased state (indicating a data value of "1"). Thus, a program operation is required only when writing a data value of "0" to the latch 50; when writing a data value of "1", the cells 30 remain in an erased state. Accordingly, the high voltages and floating gate charge times associated with programming the cells 30 are eliminated when writing a data value of "0" to the latch 50, thereby reducing power consumption and required during write operations.

This is in marked contrast to conventional non-volatile latches such as, for instance, the prior art latch 1 shown in FIG. 1. There, a first data value (e.g., a "1") is written by programming cell PC1 and erasing cell PC2, and a second data value (e.g., a "0") is written by erasing cell PC1 and programming cell PC2. Thus, both a program operation and an erase operation are required for every write operation to the latch 1, irrespective of the data value to be written. Accordingly, the positive voltages and floating gate charge times associated with programming a PMOS memory cell, as well as the high negative voltages associated with erasing a PMOS memory cell, are required for each and every write operation.

Figure 2:
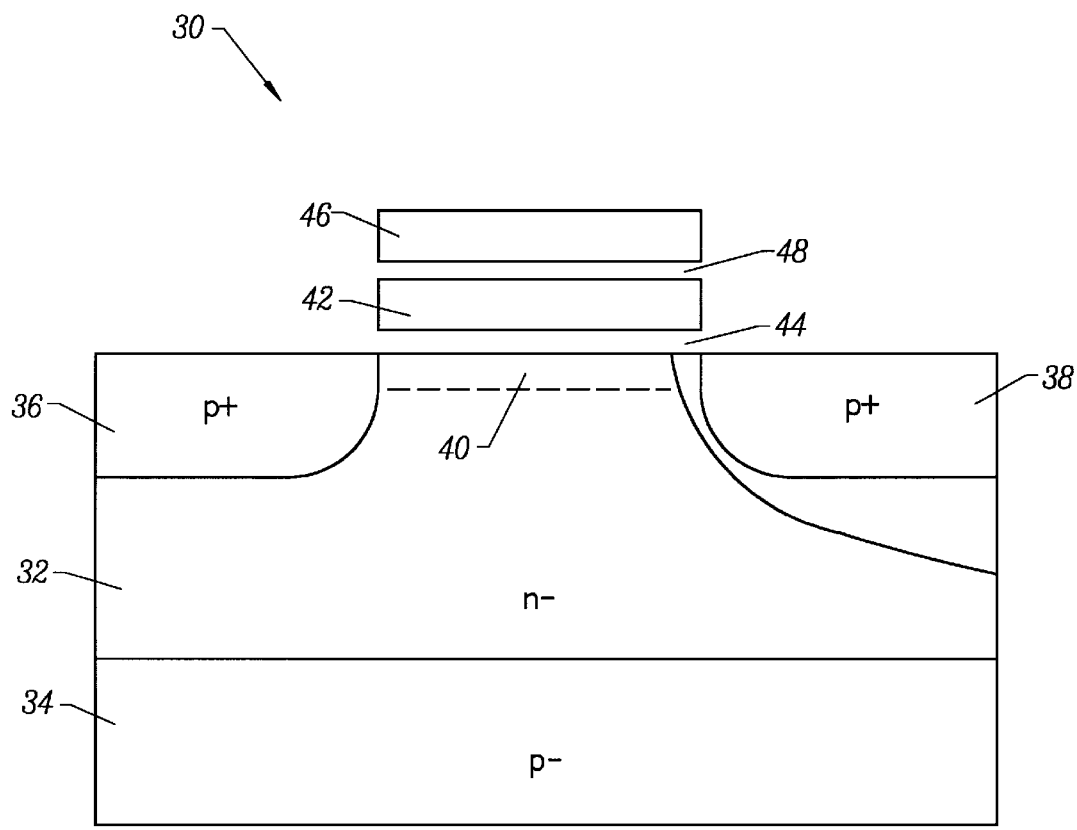
FIG. 2 is a cross-sectional view of a PMOS floating gate memory cell.

In preferred embodiments, the latch 50 includes four PMOS memory cells 30, as shown in FIG. 2. Although only one cell 30 is necessary to store data, the additional three cells 30 ensure data validity in two ways. First, since alignment errors in one row (or column) of an MOS cell array are typically complementary in adjacent rows (columns), alignment errors in one row (column) of the 2×2 cell array is compensated by errors in the other row (column). Second, one of the cells 30 employed in present embodiments may be defective without comprising data integrity. Indeed, with $V_{CC}$=5 volts and $V_{trip}$=$V_{CC}$/3 =1.67 volts, two of the four cells 30 can be defective without compromising data validity, since two programmed cells 30 result in a $V_{N2}$=(2)(30μA)(30kΩ)=1.8 volts>$V_{trip}$. In contrast, since the binary states of both cells PC1 and PC2 are used to represent data values, the integrity of that data is compromised if either of the cells PC1 or PC2 is defective.

The $V_{trip}$ of the CMOS inverter 66 is set low, i.e., at $V_{CC}$/3, to ensure proper operation of the latch 50 in $V_{CC}$ applications. When the pass transistor 62 is conductive, its gate voltage $V_G$ is one diode drop $V_D$ above its source voltage $V_S$, where $V_D$ is about 0.7 volts. Since the gate of the pass transistor 62 is coupled to receive the signal RECALL, which has a maximum voltage equal to $V_{CC}$, $V_{N2}$ is clamped at $V_{CC}$−0.7volts. Accordingly, where $V_{CC}$ is, say, 1.5 volts, $V_{N2}$ is clamped at about 0.8 volts. Since $V_{trip}$=$V_{CC}$/3=0.5 volts, $V_{N2}$ may still exceed $V_{trip}$ which, as described above, is necessary to provide a latch a logic high value in the latch circuit 50. However, if the PMOS transistor 66p were scaled relative to that of the NMOS transistor 66n, as in a standard CMOS inverter where $V_{trip}$ is equal to $V_{CC}$/2 rather than to $V_{CC}$/3, and where $V_{CC}$=1.5 volts, then $V_{trip}$ would be equal to 0.75 volts. Since in this case $V_{trip}$ is greater than the maximum value of VN2, the channel current sourced by the programmed cells 30 would be unable to trip the CMOS inverter. As a result, a logic high value would be stored in the latch circuit 50, irrespective of whether the cells 30 are in a programmed state or an erased state, thereby comprising data validity.

In other embodiments of the present invention, the input stage B may be replaced with suitable logic which adjusts the bit line voltage in accordance with the binary value of the input data. In still other embodiments, the input stage may be replaced with suitable logic which selectively applies the program voltage $V_P$ to the control gates 46 of the cells 30 in accordance with the input data.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

We claim:

1. A non-volatile latch comprising:
   one or more PMOS floating gate memory cells each having a control gate coupled to a word line, a source coupled to a common source node, and a drain coupled to a first node, said one or more memory cells being in either an erased state or a programmed state;
   a resistive element having a first terminal and a second terminal, the first terminal of the resistive element being coupled to said first node and the second of the resistive element being coupled to ground potential; and
   a latch circuit having an input terminal coupled to said first node and having an output terminal, said latch circuit latching said binary data whether said one or more memory cells are in said programmed state or in said erased state.

2. The non-volatile latch of claim 1, further comprising a first pass transistor having a first terminal, a second terminal and a gate, the first terminal of the first pass transistor being coupled to said first node, the gate of the first pass transistor coupled to receive the recall signal, and the second terminal of the first pass transistor being coupled to said input terminal of said latch circuit.

3. The non-volatile latch of claim 2, further comprising a second pass transistor coupled between said second terminal of said resistive element and ground potential and having a gate to receive said recall signal.

4. The non-volatile latch of claim 1, further comprising an input terminal at which input data is received, wherein said first node is coupled to receive said input data.

5. The non-volatile latch of claim 4, further comprising an input transistor coupled between said first node and ground potential and having a gate coupled to said input terminal of said non-volatile latch.

6. The non-volatile latch of claim 5, further comprising a current limiting transistor coupled between said input transistor and ground potential and having a gate coupled to a bias voltage, the magnitude of which determines a maximum flow of current through said current limiting transistor.

7. The non-volatile latch of claim 5, further comprising a pass transistor coupled between said first node and said input transistor signal.

8. The non-volatile latch of claim 1, wherein said latch circuit comprises:
   a buffer circuit coupled between said input and output terminals of said latch circuit; and
   a pass gate coupled in parallel with said buffer circuit.

9. The non-volatile latch of claim 8, wherein said pass gate comprises:
   a PMOS transistor coupled between said input and output terminals of said latch circuit and having a gate coupled to receive said recall signal; and
   an NMOS transistor coupled between said input and output terminals of said latch circuit and having a gate coupled to receive a complement of said recall signal.

10. The non-volatile latch of claim 8, wherein said buffer circuit comprises first and second inverters connected in series between said input and output terminals of said latch circuit.

11. The non-volatile latch of claim 10, wherein said first inverter comprises a CMOS inverter having a PMOS transistor coupled between a supply voltage and an input terminal of said second inverter and an NMOS transistor coupled between said input terminal of said second inverter and ground potential, said PMOS transistor and said NMOS transistor each having a gate coupled to said input terminal of said latch circuit.

12. The non-volatile latch of claim 11, wherein said first inverter has a trip point equal to less than one-half the supply voltage.

13. The non-volatile latch of claim 1, further comprising a first pass transistor having a first terminal, a second terminal and a gate, the first terminal of the first pass transistor being coupled to the first node, the gate of the first pass transistor being coupled to receive a recall signal, and the second terminal of the first pass transistor being coupled to the input terminal of the latch circuit.

14. The non-volatile latch of claim 13, further comprising a second pass transistor having a first terminal, a second terminal and a gate, the first terminal of the second pass transistor being connected to the resistive element, the second terminal of the second pass transistor being coupled to ground potential and the gate of the second pass transistor being coupled to the recall signal.

15. A non-volatile latch comprising:
   one or more PMOS floating gate memory cells, each memory cell having a control gate, a source and a drain, the control gate of each memory cell being coupled to a word line, the source of each memory cell being coupled to a common source node, and the drain of each memory cell being coupled to a first node, each of the one or more memory cells being in either an erased state or a programmed state;
   a resistive element coupled between the first node a ground potential; and
   a latch circuit latching binary data indicating whether said one or more memory cells are in the programmed state or in the erased state, the latch circuit having an input terminal, an output terminal, a buffer circuit and a first pass gate, the input terminal of the latch circuit being coupled to the first node, the buffer circuit being coupled between the input terminal and the output terminal of the latch circuit, the first pass gate being coupled in parallel to the buffer circuit.

16. The non-volatile latch of claim 15, wherein the first pass gate comprises:
   a PMOS transistor coupled between the input and output terminals of the latch circuit, the PMOS transistor having a gate coupled to receive a recall signal; and
   an NMOS transistor coupled between the input and output terminals of the latch circuit, the NMOS transistor having a gate coupled to receive a complement of the recall signal.

17. The non-volatile latch of claim 15, wherein the buffer circuit comprises a first inverter and a second inverter connected in series between the input and output terminal of the latch circuit.

18. The non-volatile latch of claim 17, wherein the first inverter comprises a CMOS inverter including:
   a PMOS transistor coupled between an input terminal of the second inverter, the PMOS transistor having a gate coupled to the input terminal of the latch circuit; and
   an NMOS transistor coupled between the input terminal of the second inverter and ground potential, the NMOS transistor having a gate coupled to the input terminal of the latch circuit.

19. The non-volatile latch of claim 18, wherein the first inverter has a trip point equal to less than one-half the supply voltage.

* * * * *